(12) United States Patent
Gatzke

(10) Patent No.: US 9,180,977 B2
(45) Date of Patent: Nov. 10, 2015

(54) SUPPLEMENTARY POWER SUPPLY APPARATUS FOR A VEHICLE, IN PARTICULAR A FLYING MACHINE

(75) Inventor: Sten Gatzke, Emtinghausen (DE)

(73) Assignee: Airbus Operations GmbH, Hamburg (DE)

( * ) Notice: Subject to any disclaimer, the term of this patent is extended or adjusted under 35 U.S.C. 154(b) by 538 days.

(21) Appl. No.: 13/464,002

(22) Filed: May 4, 2012

(65) Prior Publication Data

US 2012/0318915 A1 Dec. 20, 2012

Related U.S. Application Data

(60) Provisional application No. 61/482,343, filed on May 4, 2011.

(30) Foreign Application Priority Data

May 4, 2011 (DE) .......................... 10 2011 100 431

(51) Int. Cl.
| | |
|---|---|
| *B64D 41/00* | (2006.01) |
| *H01L 31/05* | (2014.01) |
| *H01L 31/042* | (2014.01) |
| *H02S 40/36* | (2014.01) |
| *H02S 10/40* | (2014.01) |

(52) U.S. Cl.
CPC ............... *B64D 41/00* (2013.01); *H01L 31/05* (2013.01); *H02S 10/40* (2014.12); *H02S 20/00* (2013.01); *H02S 40/36* (2014.12); *B64D 2211/00* (2013.01); *Y02E 10/50* (2013.01)

(58) Field of Classification Search
USPC .................. 244/58, 172.7, 131; 136/244, 245
See application file for complete search history.

(56) References Cited

U.S. PATENT DOCUMENTS

| | | | | | |
|---|---|---|---|---|---|
| 3,993,505 | A | * | 11/1976 | Pack, Sr. | 136/244 |
| 4,768,738 | A | * | 9/1988 | Weinert | 244/53 R |
| 4,854,975 | A | * | 8/1989 | Krause | 136/262 |
| 5,810,284 | A | * | 9/1998 | Hibbs et al. | 244/13 |
| 6,056,237 | A | * | 5/2000 | Woodland | 244/3.15 |
| 6,224,016 | B1 | * | 5/2001 | Lee et al. | 244/30 |
| 6,742,741 | B1 | * | 6/2004 | Rivoli | 244/12.1 |
| 8,030,569 | B2 | * | 10/2011 | Nakata | 136/250 |

(Continued)

FOREIGN PATENT DOCUMENTS

| | | |
|---|---|---|
| DE | 29908439 U1 | 7/1999 |
| DE | 20 2008 010 208 U1 | 11/2008 |

(Continued)

OTHER PUBLICATIONS

German Office Action for Application No. 10 2011 100 431.2 dated Mar. 30, 2012.

*Primary Examiner* — Christopher P Ellis
(74) *Attorney, Agent, or Firm* — Jenkins, Wilson, Taylor & Hunt, P.A.

(57) ABSTRACT

A supplementary power supply apparatus for electric onboard consumers of a vehicle, in particular flying machines. The apparatus includes openly disposed visible solar surfaces of several solar cells that are arranged in areas on the surface of an outer skin of the vehicle or integrated in the latter in the manner of a layer. Each of the solar cells includes at least two electric terminals by means of which the solar cells may be interconnected to form a solar generator, and several ones of the electric terminals are configured as generator terminals of the solar generator for one or several predetermined voltages between two respective ones of these generator terminals.

9 Claims, 4 Drawing Sheets

(56) References Cited

U.S. PATENT DOCUMENTS

| | | | |
|---|---|---|---|
| 8,894,002 B2 * | 11/2014 | Goelet | 244/26 |
| 2006/0261213 A1 * | 11/2006 | Lavan | 244/30 |
| 2009/0272841 A1 * | 11/2009 | Sinsabaugh et al. | 244/30 |
| 2013/0312809 A1 * | 11/2013 | Luch et al. | 136/244 |

FOREIGN PATENT DOCUMENTS

| | | |
|---|---|---|
| DE | 202010010208 A1 | 12/2010 |
| DE | 10 2009 057 460 A1 | 6/2011 |
| DE | 102009057208 A1 | 6/2011 |
| GB | 2437946 A | 11/2007 |

* cited by examiner

SUPPLEMENTARY POWER SUPPLY APPARATUS FOR A VEHICLE, IN PARTICULAR A FLYING MACHINE

CROSS-REFERENCE TO RELATED APPLICATIONS

The present application claims priority from German Application DE 10 2011 100 431.2, filed on May 4, 2011, and claims the benefit of U.S. Provisional application 61/482,343, filed on May 4, 2011, each of which is hereby incorporated in its entirety by reference.

FIELD OF THE INVENTION

The present invention generally relates to self-sufficient power supply systems for vehicles assisting the energy balance, in particular in the case of a flying machine on the ground, in flight, or during emergency operation. In particular the present invention relates to a supplementary power supply apparatus for a vehicle which uses solar cells providing at least one output voltage that may be realized in a flexible manner without converters.

BACKGROUND

At present it is customary for aircraft to furnish the power required by electric onboard systems with the aid of an auxiliary power unit (APU) while on the ground and with the aid of generators in the engines of the aircraft in flight operation.

Owing to local noise and exhaust gas regulations, the use of the APU on the ground is partly restricted. In such cases there is a possibility of meeting the electric power requirements through a ground power unit (GPU) or air starter unit (ASU) that is present externally of the aircraft. A GPU or an ASU is moreover employed when the battery of an APU of the aircraft is exhausted so that it is not possible to start the APU of the aircraft. This may bring about delays in air traffic. As the provision of a GPU or ASU is a service on the part of the respective airport, making use of this incurs additional costs for the operator of the aircraft.

In the case of aircraft that are to meet a particular requirement profile of the ETOPS (Extended-range Twin-engine Operation Performance Standard) it is mandatory for certain flight routes to add on the APU in flight operation so as to ensure a sufficient supply of electric current for the case that an engine and thus the generators integrated therein should fail. As a result the fuel consumption increases, the maintenance interval for the APU is shortened, and the operating costs of the aircraft are increased accordingly.

Furthermore it may happen that an aircraft having left the parking position still has to wait on a taxiway of an airport for several hours because the runway is closed, e.g. due to an incident. Particularly in the case of long-haul aircraft it is then frequently necessary to request a GPU as well as an air conditioning truck, for without the power supply from the generators driven by the running engines it is not possible to guarantee sufficient air conditioning of the aircraft's cabin.

I.e., the energy consumption of an aircraft occupied to capacity can not be covered in every situation without engines running, particularly when on the ground.

SUMMARY

Various embodiments of the invention provide an improved supply of the electric systems of an aircraft with electric power.

Some embodiments of the invention provide a solar generator arranged on a surface of an outer skin of a vehicle, for example on the surface of a fuselage outer skin of a flying machine, as a supplementary power supply apparatus, e.g. as a supplementary electricity supply, so that the former may be configured in a flexible manner or may be readily reconfigured, in order to be able to directly provide a required predetermined output voltage, for example for feeding a particular onboard system of the vehicle; in other words, additional converters for the provision and/or stabilization of the output voltage may be dimensioned smaller or omitted altogether.

To this end a supplementary power supply apparatus for electric onboard consumers of a vehicle, in particular a flying machine is being proposed, which includes openly disposed, visible solar surfaces of several solar cells that are arranged in areas on the surface of an outer skin of the vehicle or integrated in the latter in the manner of a layer.

To this end, each of the solar cells includes at least two electric terminals by means of which the solar cells may be interconnected to form a solar generator. Several ones of the electric terminals are configured as generator terminals of the solar generator for one or several predetermined voltages between two respective ones of these generator terminals.

Suitable solar cells are, e.g., thin-film solar cells. It should moreover be noted that basically any type of solar cells may be used. Thus there is also the option of using, e.g., higher-capacity solar cells for instance on the basis of silicon, in which case the efficiency gain must possibly have to balanced against increased weight.

In a particular embodiment several solar panels are mechanically connected to each other by means of complementarily formed marginal portions overlapping in particular in form-fit engagement and fastened in the marginal portions on the outer surface of the vehicle by means of fasteners. In the marginal portions of each solar panel at least one of at least two terminal poles of the solar panel may be integrated for a serial or parallel electrical interconnection of the solar panels.

In one embodiment at least a part of the fastener is configured as combined fastening and contacting bolts. The combined fastening and contacting bolts are then connected by at least one of the terminal poles of the respective connected solar panels, being the electric terminals, to the generator terminals of the solar generator.

In an alternative embodiment the outer skin of the vehicle is at least partly formed by composite shell components which consist of or include a composite material. Here the visible solar surfaces may be arranged at least in a partial area on the surface of the composite shell components or may be integrated as a functional layer for power generation, in particular so as to terminate with the outer surface. For example, by means of an outer laminate layer including solar cells the outer skin or shell of the vehicle may be supplemented with a power generation functional layer having the visible solar surface which may terminate with the outer surface. Hereby two functions are united in the outer skin or shell, namely, the original static structural function, and additionally as an innovation a power generation function.

In an advantageous development a control circuit is provided which is or may be connected by means of at least one input terminal to the generator terminals of the solar generator and includes at least one output terminal.

The control circuit may for example include fixedly wired or programmable circuit logic and may be configured such that the at least one output terminal may be interconnected with at least two of the generator terminals, particularly in response to particular conditions or control commands, such that a predetermined output voltage is present at the at least one output terminal.

In particular embodiments the control circuit may to this end furthermore be equipped at least with a control input, in particular a bidirectional control bus, through which the provision of a respective predetermined voltage to the at least one output terminal may be controlled.

The supplementary power supply apparatus in accordance with various embodiments of the invention is particularly well suited for a flying machine.

In accordance with a some embodiments of the invention, one or several solar generators are arranged, preferably on the fuselage outer skin of the flying machine, for the supplementary power supply apparatus for electric onboard systems on board of a flying machine.

One difference from known solar airplanes resides in the fact that solar cells were in the prior art previously arranged only on the airfoils of an aircraft in order to operate a drive system of the aircraft with electric power from these solar cells as a main power supply. It was previously not considered to arrange solar cells on the fuselage of a flying machine and use them as a supplement or substitute for the APU.

In other words, embodiments of the invention provide integration of a supplementary power supply apparatus having the form of a solar generator on or in the outer skin, particularly in the fuselage outer skin or fuselage shell, of a flying machine.

Accordingly, embodiments of the invention provide a flying machine having the features of the above-described embodiments.

The flying machine includes a fuselage having at least one fuselage portion and a fuselage outer skin. At least one solar generator is arranged at least in the area, in particular within a predetermined sector angle, of the back of the aircraft on a surface of the fuselage outer skin or is integrated, in particular structurally, in the fuselage outer skin.

In certain embodiments the solar cells are connected, in particular in at least one fuselage portion, to form at least one solar module. To this end the solar cells may be combined into solar panels.

In the context of a flying machine it should be noted that one or the several predetermined voltages may correspond to the voltages that are required by particular consumer systems in a flying machine. These consumer systems may be, for example, a fuel management system and/or electrically operated devices of an onboard lavatory and/or electrically operated devices of an onboard kitchen and/or electrically operated devices of the cabin air conditioning, but also an energy storage device for the intermediate storage of electric power that may in a given case be coupled with suitable converter means for the supply of onboard consumers in an emergency, or the like.

Embodiments of the invention further relate to a method for selectively furnishing a predetermined voltage by means of a multiplicity of solar cells on at least one output terminal.

The method in accordance with various embodiments of the invention essentially provides the same features as the supplementary power supply apparatus in accordance with embodiments of the invention and includes at least the following steps:

interconnecting the solar cells by means of at least two electric terminals each of the respective solar cells to form a solar generator;

executing several ones of the electric terminals as generator terminals of the solar generator for one or several predetermined voltages between two respective ones of these generator terminals; and connecting the at least one output terminal to at least two of the generator terminals between which the predetermined output voltage is present.

The presently proposed supplementary power supply apparatus, or method for selectively furnishing a predetermined voltage by means of a multiplicity of solar cells, presents at least one of the following advantages in the case of a flying machine as a vehicle.

Improved independence of the flying machine of an external power supply on the ground; maintaining the charge condition of batteries of the flying machine such as, e.g., in business jets, in cases of a prolonged stationary condition; corresponding prolongation of the service life of the flying machine's APU and other active power generation systems, as well as an extension of the maintenance intervals of such systems; reduction of the fuel consumption by the proportion generated through ohmic loads, and the concurrent reduction of the $CO_2/NO_X$ emissions of the engines; possibly meeting a particular ETOPS profile without having to add on the APU of the flying machine in flight.

The presently proposed supplementary power supply apparatus can thus not only provide a power supply of a flying machine on the ground independently of an APU, but can in particular assist the energy budget of the flying machine even during flight operation.

BRIEF DESCRIPTION OF THE DRAWINGS

Further aspects of embodiments of the invention as well as practical examples in this regard shall be explained in more detail below in conjunction with the annexed figures of the drawings. Parts or components having similar functions are partly provided with identical reference symbols. The terms "left", "right", "top", "bottom" as used in the description of the practical examples relate to the figures of the drawings in an orientation where the designation of the figure and reference symbols can be read normally.

DESCRIPTION

Figure 1:
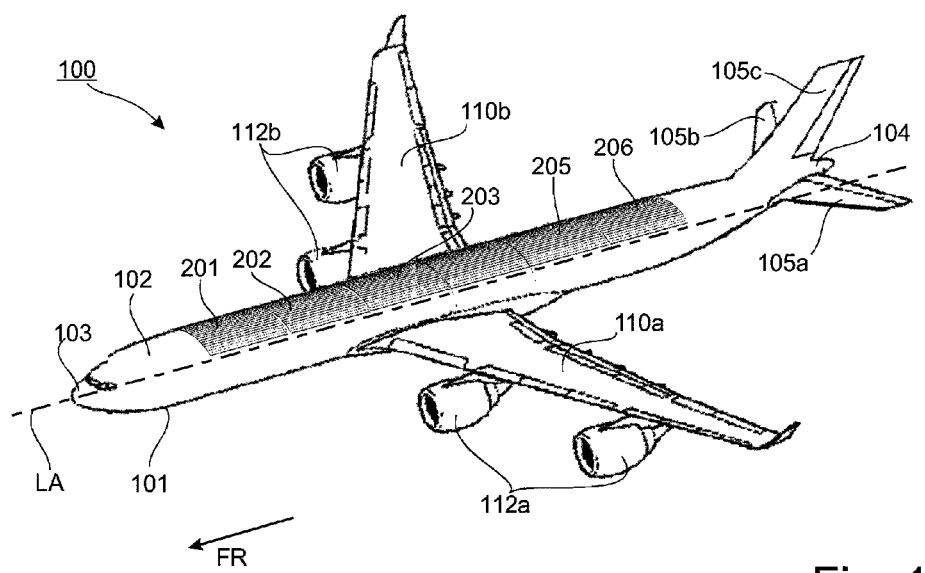
FIG. 1 is a perspective view of an aircraft including a supplementary power supply apparatus on the upper side of the fuselage in accordance with one embodiment of the present invention.

FIG. 1 shows a perspective representation of an aircraft 100, for example an Airbus A340, which includes a supplementary power supply apparatus in accordance with an embodiment of the invention. The aircraft 100 has a fuselage 101 with a fuselage outer skin 102 and a longitudinal axis LA, the direction of which substantially corresponds to the regular direction of flight FR of the aircraft 100. The front end of the fuselage 101 when viewed in the direction of flight FR is formed by an aircraft nose 103. At the rear end of the fuselage 101 there is the aircraft tail 104, in the area of which the tail assembly of the aircraft including two fins 105*a* and 105*b* with elevator arranged thereon as well as a fin 105*c* having a vertical rudder is arranged. Approximately in the center of the fuselage 101 there are a right wing 110*a* and a left wing 110*b* on the left and on the right relative to the direction of flight FR. Under the wings 110*a* and 110*b* two respective right engines 112*a* and two respective left engines 112*b* are suspended.

In the upper area of the fuselage outer skin 102, or on the back of the fuselage 101, as it were, six solar modules 201 through 206 are arranged in the represented practical example, which are solar generators constituting a supplementary power supply apparatus in accordance with an embodiment of the invention for the aircraft 100.

Figure 2:
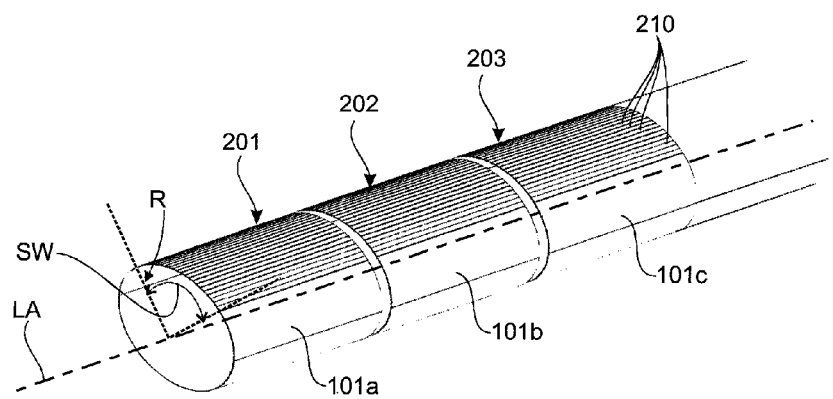
FIG. 2 is a schematic representation of three fuselage portions of the aircraft of FIG. 1, each having a solar module arranged in the upper segment for the supplementary power supply apparatus in accordance with an embodiment of the invention.

In a schematic representation for the sake of clarity, FIG. 2 shows three of fuselage portions 101*a*, 101*b*, 101*c* of the fuselage 101 of the aircraft 100 of FIG. 1 that are aligned on the longitudinal axis LA. On each one of the represented fuselage portions 101*a*, 101*b*, 101*c* there is a respective one of the solar modules 201, 202, 203 of the supplementary power supply apparatus in accordance with an embodiment of the invention.

Each fuselage portion is basically tubular, with the fuselage outer skin 102 of the aircraft fuselage 101, particularly in the area of the solar modules 201, 202, 203, being approximately cylindrical, i.e., having a substantially regular curvature at least in this area. The fuselage outer skin covered by the respective solar module 201, 202, 203 of the respective fuselage portion 101*a*, 101*b*, 101*c* then corresponds to the jacket surface of a tube sector. In the case of an approximately cylindrical tube sector, the sector and thus also the sector jacket surface may be defined and specified by means of the radius R of the fuselage 101 in the sector and a sector angle SW. As is represented in FIG. 2, the circle center may be situated on the longitudinal axis LA but does not necessarily have to. In common aircraft types, for example of the manufacturer Airbus, a surface of the fuselage outer skin which may be specified by means of the radius R and a sector angle SW of about 70 to 80 degrees is accordingly available for the solar modules 201 through 206 on the back of the fuselage 101. In transport plane variants which mostly have no windows in the cargo hold area of the fuselage, sector angles of up to more than 180 degrees are possible.

In order to illustrate the capacity of the presently proposed supplementary power supply apparatus, the electric power that may be furnished by a solar generator in accordance with an embodiment of the invention on the back of the fuselage of an aircraft shall be estimated in the following. This estimation is based on aircraft families of the applicant's while assuming an array of 700 solar cells on the part of the aircraft fuselage or fuselage 101 most closely approaching a cylindrical shape. Moreover a very conservative efficiency of the solar cells of 10% was assumed. The following estimations are thus based on conservative assumptions while furthermore not considering a possible efficiency gain during flight operation on account of the low environmental temperature at cruising altitude.

In the case of the aircraft fuselage of a first exemplary aircraft, an Airbus A320, there accordingly results for a sector angle of 70 degrees a sector arc length of about 2.414 m and, when assuming a usable fuselage length of 25 m, a solar cell surface area of about 60 m$^2$. The supplementary power supply apparatus then has a rated output of about 6 kVA at a weight of approx. 15.6 kg.

In the case of the aircraft fuselage of a second exemplary aircraft, an Airbus A330/340, there results for a sector angle of 70 degrees a sector arc length of about 3.438 m and, when assuming a usable fuselage length of 55 m, a solar cell surface area of about 189 m$^2$. The supplementary power supply apparatus then has a rated output of about 18.9 kVA at a weight of approx. 49.14 kg.

In the case of the fuselage of a third exemplary aircraft, an Airbus A350XWB, there results for a sector angle of 70 degrees a sector arc length of about 3.602 m and, when assuming a usable fuselage length of 55 m, a solar cell surface area of about 198 m$^2$. The supplementary power supply apparatus then has a rated output of about 19.8 kVA at a weight of approx. 51.48 kg.

A fourth exemplary aircraft, an Airbus A350XWB, has a fuselage presenting less curvature so that a larger sector angle is available. On a larger part of the fuselage surface it is accordingly possible to arrange more solar cells. In this case it was assumed that it is possible to arrange about 800 solar cells on the back of the aircraft. In the fourth exemplary aircraft there results for a sector angle of 80 degrees a sector arc length of about 4.111 m and, when assuming a usable fuselage length of 55 m, a solar cell surface area of about 226 m$^2$. At the furthermore assumed efficiency of 10% it is possible to generate a rated output of 22.6 kVA at a weight of approx. 58.76 kg.

In the case of the fuselage of a fifth exemplary aircraft, an Airbus A380, there results for a sector angle of 80 degrees a sector arc length of about 4.968 m and, when assuming a usable fuselage length of 60 m, a solar cell surface area of about 298 m$^2$. Thus there results for the supplementary power supply apparatus a rated output of 29.8 kVA at a weight of approx. 77.48 kg.

It may furthermore already be seen in FIG. 2 that each of the solar modules 201, 202, 203 is composed of several solar panels 210. A solar panel 210 then has the shape of an elongate cylinder jacket sector portion and is arranged, with its longitudinal axis substantially in parallel with the longitudinal axis LA of the aircraft 100, on the surface of the respective fuselage portion 101*a*, 101*b*, 101*c*. Adjacent solar panels 210 are mechanically and electrically connected to each other.

A solar panel 210 has at least two electric terminal poles where a photoelectric voltage generated by several solar cells in the solar panel may be tapped at sufficient irradiation of its visible solar surface, usually by sunlight or moonlight (i.e., sunlight reflected at the moon), so that in accordance with the capacity of the solar panel a certain current may be output at this output voltage.

A plurality of solar panels 210 thus form the respective solar module 201, 202, 203. Solar modules of adjacent fuselage portions 101*a*, 101*b*, 101*c* may also be connected to each other mechanically and/or electrically, so that the individual solar modules 201, 202, 203 constitute a large solar generator on the back of the aircraft fuselage.

A practical example shall in the following be explained by making reference to FIGS. 3*a* to 3*c*, wherein a supplementary power supply apparatus in accordance with an embodiment of the invention is formed on the back of the fuselage 101 by solar modules which in turn are formed of several solar panels 210 arranged in a shingle-type manner.

In this context the term "shingled", similar to the case of roofing shingles, means that two immediately adjacent solar panels overlap at least in a marginal portion, with the width of the marginal portion being small in comparison with the openly disposed, visible solar surface of the solar panel in the case of solar panels 210.

Figure 3A:
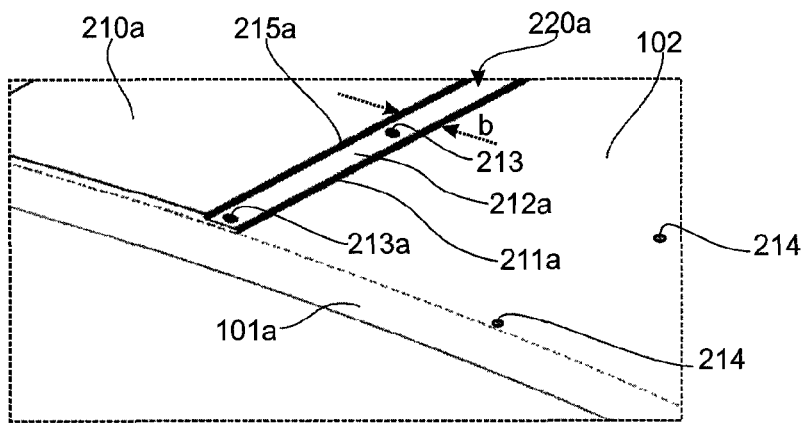
FIGS. 3a to 3c are perspective representations of the arrangement of individual solar panels for the constitution of a solar module on a fuselage portion of FIG. 2.
Figure 3B:
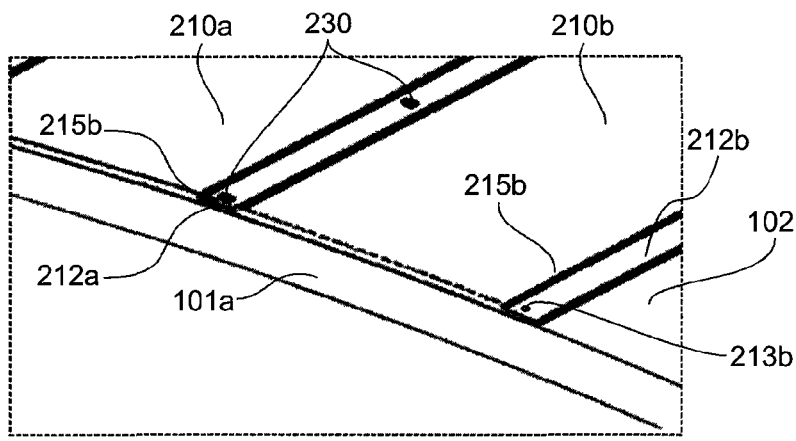
Figure 3C:
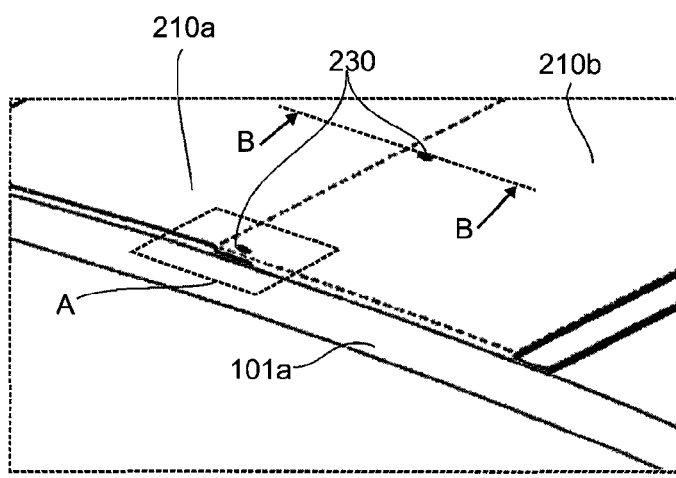

FIGS. 3a to 3c each show a sectional view of a fuselage portion, e.g. fuselage portion 101a of FIG. 2, wherein only a part of the outer shell or fuselage outer skin of the aircraft 100 is shown. The external surface of the outer shell is a part of the fuselage outer skin 102. In the framework of the following description of the arrangement and mechanical fastening and electrical contacting of the solar panels 210 the configuration of the solar panels 210 will also be described, all of which are constructed substantially identically, particularly when the solar panels are arranged in an area of the fuselage having an approximately identical curvature.

In FIG. 3a a first solar panel 210a is already in place on the fuselage outer skin 102 of the fuselage portion 101a. The first solar panel 210a has a stepped marginal strip 212a at a margin 211a. On the step formed by the marginal strip 212a a contact surface 220a of one of the at least two electric terminal poles of the solar panel 210a is provided.

The marginal strip 212a has a width b that is substantially identical over the entire length of the solar panel 210a and protrudes as a lower contact tongue from an inner edge 215a of the solar panel 210a in the direction of the connecting next or second solar panel 210b (cf. FIGS. 3b and 3c). The contact tongue is presently referred to as a lower contact tongue, for in the installed condition relative to the fuselage surface 102 it is situated below a complementarily formed upper contact tongue of the second solar panel 210b.

The marginal strip 212a includes through holes 213a for fastening the solar panel 201a to the outer shell of the fuselage portion 101a. To this end, through holes 214 each corresponding to each other in position and size are provided in the outer shell. It should be noted that the through holes 214 provided with reference symbols in FIG. 3b are intended for fastening of the second solar panel 210b additionally represented in FIGS. 3b and 3c and of a third solar panel (not shown in FIGS. 3a to 3c) correspondingly adjacent to the latter.

In FIG. 3b the second solar panel 210b is furthermore represented transparently, in addition to the representation in FIG. 3a, on the fuselage surface 102 of the fuselage portion 101a. Just like the first solar panel 210a, the second solar panel 210b has a marginal strip 212b which is identical in its shape with the marginal strip 212a of the first solar panel 210a. I.e., the marginal strip 212b has a constant width over the entire length of the solar panel 210b and correspondingly serves as a lower contact tongue for the electrical connection with an immediately connecting, next solar panel (not shown).

The second solar panel 210b has on the long side facing the first solar panel 210a an upper contact tongue realized complementarily with the lower contact tongue of the first solar panel 210a. Just like the lower contact tongue, the upper contact tongue is constituted by a correspondingly stepped marginal strip 215b. At the upper contact tongue there is also on the step formed by the stepped marginal strip 215b a second contact surface of one of the at least two electric terminal poles of the second solar panel 210b.

The second contact surface at the upper contact tongue of the second solar panel 210b faces the first contact surface of the first solar panel 210a. For an electrically conductive connection of the adjacent solar panels 210a and 210b the superimposed contact surfaces of the first and second solar panels 210a and 210b are shaped to be congruent, i.e., adapted to each other.

The several solar cells of a solar panel usually have a layered structure, with at least two terminal poles of a solar cell being a back contact and a front contact between which a photoelectric voltage that is dependent on the used materials is generated when light is irradiated on the visible solar surface of the solar cells. Here the back contacts or the front contacts, respectively, of the several solar cells are correspondingly coupled in every solar panel, for example monolithically, with the contact surface of the respective lower or upper contact tongue of the solar panel. Thus, for example the respective lower contact tongue constitutes a front contact of the solar panel, and the upper contact tongue constitutes a back contact of the solar panel. In this way the solar panels 210 mounted in a fuselage portion 101a, 101b, 101c may be electrically interconnected to form a solar generator having a correspondingly higher output than a single solar panel.

As was already mentioned, in this practical example immediately adjacent solar panels 210 overlap by means of lower and upper contact tongues formed in the marginal area of the long side. The marginal strips 212a and 215b of the adjacent solar panels 210a, 210b are realized complementarily with each other for this purpose. Adjacent solar panels 210a, 210b as represented in FIGS. 3b and 3c may thus be shingled such that the surfaces on the bottom side and the top side of the solar module thus constituted are substantially planar.

By way of example, each solar panel 210, 210a, 210b contains one or several thin-film solar cells on a support such as a metallic foil or a high-temperature polymer such as a polyimide. A certain number of the thin-film solar cells are already interconnected, for example monolithically, in the respective solar panel for a defined output voltage of the solar panel. I.e., each solar panel is configured to furnish a predetermined output voltage between the front contact and the back contact of the solar panel starting from a threshold irradiation of its visible solar surface with light. The maximum output current intensity of the solar panel may be preset through the number of solar cells per solar panel that are already connected in parallel in the solar panel.

In the case of the presently described embodiment the individual solar panels contain thin-film solar cells which are formed on a suitable support material such as, e.g., a polyimide synthetic substrate. The thin-film solar cells may for instance be CIS or CIGS thin-film solar cells. Such solar cells are based on a combination of copper (Cu), indium (In), gallium (Ga), sulfur (S) and selenium (Se). Currently marketed solar cells of this kind including the necessary circuitry structures have a weight of approximately 260 g/m$^2$ and already attain efficiencies of about 20% and more. The thin-film solar cells may be manufactured in different colors, or even transparent. The latter offers the possibility of a virtually invisible solar generator on the outer surface of a flying machine such as the aircraft 100 of FIG. 1.

Figure 5:
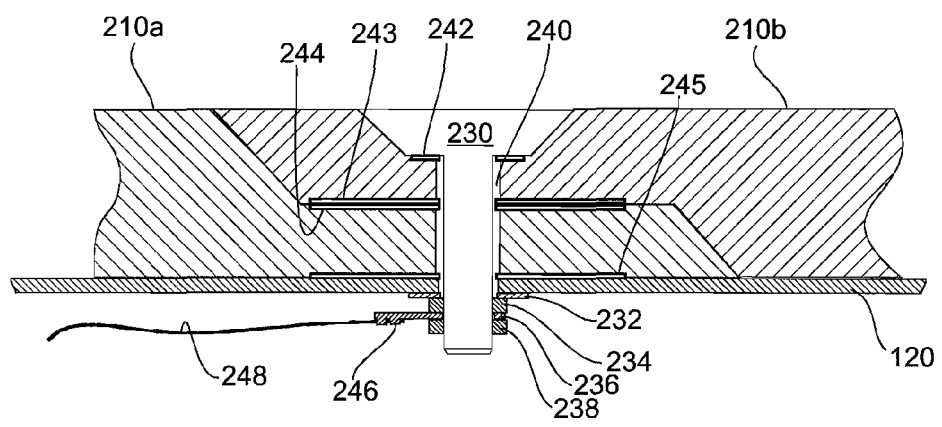
FIG. 5 is a cross-sectional representation of the section B-B of FIG. 3c, namely, of the connection of two adjacent solar panels by means of a connecting and fastening bolt for electrical contacting of the supplementary power supply apparatus.

For the purpose of mechanical fastening—but also of electrical contacting as visualized in FIG. 5—of the individual solar panels 210, 201a, 201b of a solar module, combined contacting and fastening bolts 230 are provided in the through holes 213 of the solar panels 210, 210a, 210b and the through holes in the outer shell of the respective fuselage portions 101a, 101b, 101c.

FIG. 3c essentially shows the arrangement of FIG. 3b, i.e., the first solar panel 210a which is in a shingled or overlapping manner connected by its lower contact tongue with the upper contact tongue of the second solar panel 210b and mechanically fastened to the outer shell of the fuselage portion 101a by means of the combined contacting and fastening bolts 230.

A detail A is marked in FIG. 3c by a dashed rectangle. Detail A in FIG. 4 is used to explain special features of a through hole in the upper marginal strip of the solar panels 210, 210a, 210b.

A section B-B in FIG. 3c passes through the first and second solar panels 210a, 210b precisely in a location with one of the combined contacting and fastening bolts 230. By means of this section B-B one option for electrical contacting of the solar panels on a solar module is visualized in FIG. 5, in order to be able to tap predetermined voltages at the supplementary power supply apparatus while avoiding converter circuits.

Figure 4:
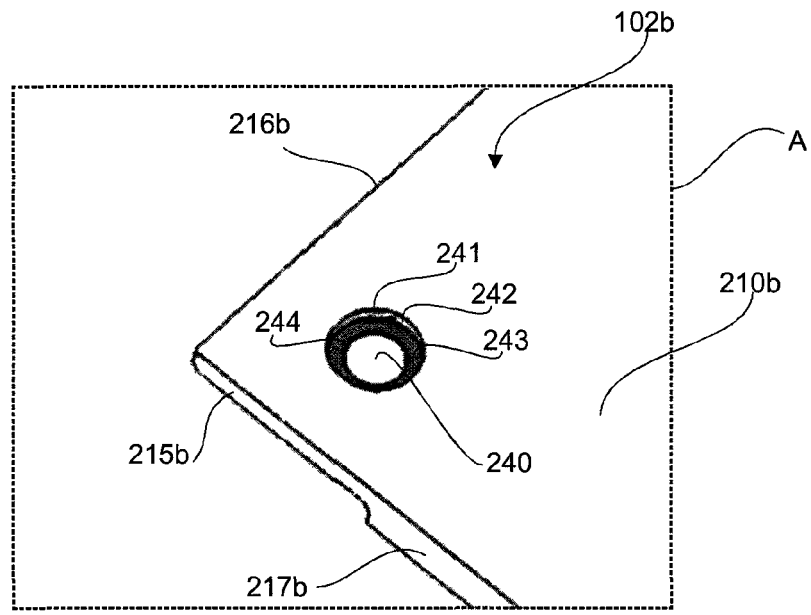
FIG. 4 is a perspective representation of detail A of FIG. 3c, namely, a fastening hole in a solar panel of FIGS. 3a to 3c.

FIG. 4 shows a fastening hole of the solar panel 210b of FIGS. 3b and 3c in a perspective detail representation. The represented fastening hole 240 is located in the marginal strip 215a which protrudes as the upper contact tongue from the solar panel 210b and runs along a long side 216b of the solar panel. Furthermore the fastening hole 240 is the first one starting out from a lateral margin 217b of the solar panel 210b.

The fastening hole 240 is a through hole which extends from the outer surface 102b through the solar panel 210b as far as the back side which, in the mounted condition, rests on the fuselage surface. In the lower area the inner diameter of the fastening hole 240 is reduced to a smaller inner diameter. The transition from the larger inner diameter to the smaller one is continuous in a first area 242 and continues, approximately in the center of the through hole, into the smaller inner diameter in the form of a shoulder 243. Hereby the fastening hole is recessed in the upper area so that a correspondingly shaped head of a combined fastening and contacting element (cf. FIG. 5), for example a rivet or a screw bolt or the like, may be countersunk in the solar panel 210b so as to result in a planar outer surface.

FIG. 5 shows the section B-B through two solar panels 210a and 210b each electrically connected to the fuselage 101 of the aircraft 100 and to each other as adjacent solar panels.

A fastening bolt 230 mechanically secures the adjacent and shingled solar panels 201a and 210b on the aircraft's structure, i.e., on the outer shell 120. The screw bolt 230 here also ensures good electrical connection between the front contact 244 of the left solar panel 210a and the back contact 243 of the right solar panel 201b.

Depending on its execution, the fastening bolt 230 may serve as a contacting element for electrically contacting the front contact 242 of the right solar panel 210b or the back contact 243 of the right solar panel 210b, and the front contact 244 of the left solar panel 210a or the back contact 245 of the left solar panel 210a, respectively. It is also possible to execute the fastening bolt 230 such as to thereby contact several of the named contacts 243, 244, 245. I.e., up to three different voltages may be tapped at the fastening bolt 230.

FIG. 5 shows the embodiment where the fastening bolt 230 is realized so as to permit electrical contacting of the front contact 242 of the solar panel 210b inside the fuselage 101 of the aircraft 100. I.e., conduction of current through the fastening bolt 230 is made possible by a corresponding configuration of the fastening hole 240 and the fastening bolt 230. In FIG. 5 the fastening bolt 230 is immobilized on the inside of the outer shell 120 by a washer 232 and a first nut 234.

In order to pass electric current, the fastening bolt 230 is electrically connected to a contact tongue 234 which is pinched between the first nut 234 and a lock nut 238 on the fastening bolt 230. A connection cable 248 is electrically fastened to the contact tongue 234 at one end thereof by means of a crimped connection 246.

It will be understood that the embodiment of the contacting may be modified in a wide range. Instead of the fastening bolts 230 a correspondingly dimensioned rivet or some other suitable connection element may also be employed, as is customary in aircraft construction. Connection of the connection cables 248 may furthermore be implemented in some other way.

It should be noted that fundamentally any fastening bolt 230 may be configured as a combined contacting and fastening element. Alternatively, however, a multiplicity of the fastening bolts may also merely be configured as fastening elements, i.e., without realizing the function of electrical contacting of the solar generator formed by solar panels and fastened on the fuselage surface. In that case only a certain number of fastening bolts are configured like the combined contacting and fastening element illustrated in FIG. 5. I.e., the options of contacting the terminal poles of the solar panels illustrated in FIGS. 4 and 5 for providing the generator terminals may then correspondingly be restricted to few particular through holes.

It will be understood that a fastening bolt 230 as a combined contacting and fastening element corresponding to the terminal poles to be contacted of the solar panels fastened by the fastening bolt 230 is equipped with correspondingly configured electric contacts and conduction paths.

As a result of the fastening of a multiplicity of solar cells as a solar generator on the fuselage surface 102 of the aircraft fuselage 101 of the aircraft 100 of FIG. 1 that is described in FIGS. 2 to 5 by way of a practical example, a multiplicity of generator terminals may be provided on the inside of the aircraft fuselage.

By means of the generator terminals devised with the combined contacting and fastening elements it is then possible to directly make available a multiplicity of different output voltages through a corresponding selection of two respective ones of these generator terminals. In this case the respective two required ones of these generator terminals may even be selected in accordance with a current light irradiation situation of the solar cells.

This is achieved with a correspondingly configured control circuit, so that virtually any required voltage and to a certain extent even the respective required current intensity may be realized "on the fly." Fundamentally it is known that—and also how—a multiplicity of solar panels may be interconnected serially and/or in parallel in order to be able to provide different voltages or different current intensities which are respective multiples of the voltage or current intensity of a solar panel.

It furthermore is to be noted that although the arrangement of solar panels 210 in FIGS. 3a to 3c was represented in the figures through an aircraft section having the form of a fuselage portion 101a, the principle may be transposed to several fuselage portions (cf. FIG. 2). Alternatively, however, it is possible to bridge several fuselage portions by means of longer solar panels that are adapted, e.g., to the length of the aircraft fuselage to be occupied. Furthermore it is conceivable to "shingle" several solar panels having a shorter length than a fuselage portion along the fuselage axis or longitudinal axis LA so as to electrically contact each other, similarly to the peripheral direction of the fuselage portion as in the previous case, or to interconnect them by means of a cable at the respective last fastening bolts at the solar panel boundaries. In other words, with regard to the total fuselage region of the aircraft covered with solar panels, the solar panels of respective fuselage portions may be in direct conductive connection with each other via corresponding contacts, or be interconnected by means of cabling technology.

Lastly it is also possible to install several supplementary power supply apparatuses separate from each other on the back of the fuselage of an aircraft. By way of example every fuselage portion might be equipped with its own supplementary power supply apparatus.

In conclusion, with regard to the implementation of the supplementary power supply apparatus by means of solar panels fastened on the outer shell or outer skin of the aircraft fuselage described in the framework of the above practical example, an alternative approach in accordance with a further aspect of various embodiment of the invention shall be described.

Composite materials are increasingly utilized for structural components of current aircraft, such as ribs, stringers and planking (shell components). Composite materials essentially consist of a matrix material such as, e.g., a resin or synthetic material (e.g. polyester resin, vinyl ester resin or epoxy resin or the like) and a fiber material such as, e.g., fibers of glass, aramide, carbon, or the like. The matrix material that is capable of absorbing and passing on the pressure loads is reinforced with the fiber material which can predominantly absorb tensile stresses.

A presently proposed supplementary power supply apparatus may also be integrated directly into a shell component of a composite material (composite shell component) as a functional layer. I.e., as a result of such integration of the supplementary power supply apparatus in accordance with an embodiment of the invention directly into the outer shell, the outer shell of the flying machine's fuselage forms a functional composite material having the added function of power generation. In this case the visible solar surfaces of the solar cells are arranged as functional layers at least in areas on the surface of the composite shell components or integrated in the composite shell components, preferably so as to terminate with the outer surface.

If the supplementary power supply apparatus is thus integrated directly into the outer shell of the aircraft, fastening bolts for individual solar panels are not required any more. The solar cells having, for instance, the form of the thin-film solar cells as mentioned in the foregoing, together with the required terminals may then be integrated directly into the fiber compound shell component. The generator terminals may again be provided on the inside, i.e., in the interior of the aircraft fuselage, and if required may also be concentrated spatially in a particularly suitable location for simplified contacting.

In the following, reference is made to FIGS. 6 and 7 for an explanation of the above-described option of flexible configuration of a solar generator of various embodiments of the invention as a supplementary power supply apparatus for at least one output voltage that is to be furnished according to demand.

Figure 6:
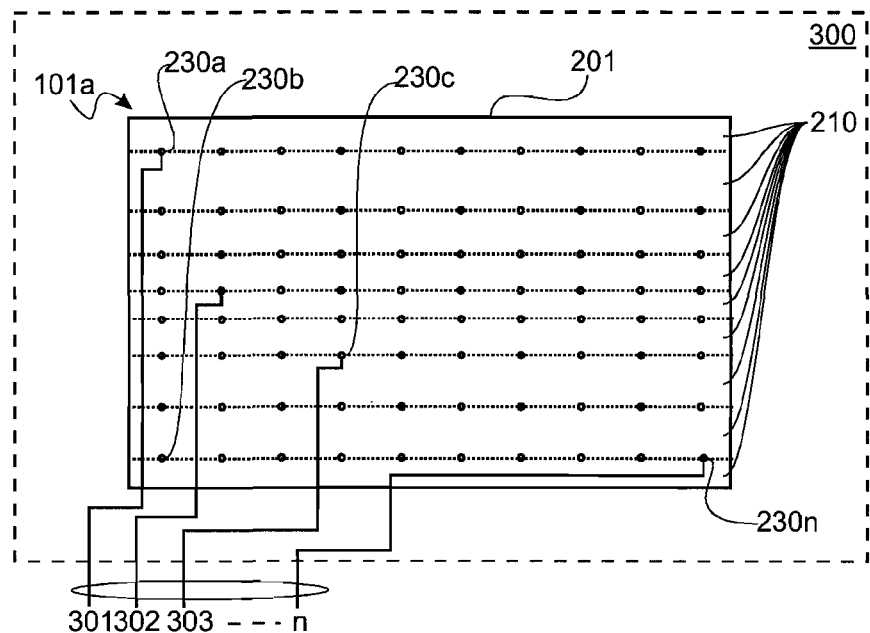
FIG. 6 is a top view of a solar module of a fuselage portion of FIG. 2 having several generator terminals of FIG. 5.

FIG. 6 shows a schematic top view of the inside of a fuselage portion 101a having on its outer side the solar module 201 which is formed of several solar panels 210 (cf. FIG. 2). By means of several fastening elements which may be realized as combined contacting and fastening bolts 230a, 230b, 230c and 230n (cf. FIG. 5), several generator terminals 301, 302, 303, . . . , n of a solar generator 300 in accordance with an embodiment of the invention are provided as a supplementary power supply apparatus by cabling.

The generator terminals 301, 302, 303, . . . , n of the solar generator 300 are connected to terminal poles of the solar panels 210 of the solar module 201 in such a way that various voltage levels relative to a reference potential are brought about at the generator terminals 301, 302, 303, . . . , n when the visible solar surface of the solar module 201 is irradiated with sunlight or moonlight.

By suitably selecting two of these generator terminals 301, 302, 303, . . . , n it is possible to tap a particular output voltage, i.e. one having a particular voltage level of particular stepped voltage levels.

If one defines the generator terminal n as a reference potential (ground), then a predetermined voltage is present between ground n and every other one of the generator terminals 301, 302, 303, . . . . I.e., if each one of the solar panels 210 is adapted for an output voltage of 6 V, then it is possible to tap a voltage of 42 V at the generator terminal 301, a voltage of 24 V at the generator terminal 302, and a voltage of 12 V at the generator terminal 303 relative to the generator terminal n. Between the generator terminals 301 and 303 a voltage of 30 V may be tapped.

In accordance with the principle explained above, it is thus possible to generate different output voltages by suitably adapting the output voltage of the solar panels 210 and by suitably contacting the terminal poles of individual ones of the solar panels 210. The respective required output voltage may then be tapped between the appropriate two generator terminals. As the supply voltage levels required by the respective ohmic consumer systems are known, the supplementary power supply apparatus in accordance with an embodiment of the invention may, of course, be adapted accordingly.

Here it should be noted for the sake of completeness that it is also possible to set a certain current capacity in addition to the respective output voltage. This may fundamentally be realized through a corresponding parallel connection of sufficient solar cells or solar panels or solar modules. As a matter of fact, both the output voltages and the current capacities can always only be realized to a certain extent, i.e., as a function of the actual irradiation of the visible solar surfaces of the solar cells and the basically systemic maximum current capacity of the existing solar cells. Corresponding planning and consideration is, however, possible when designing the overall system, so that the supplementary power supply apparatus including the solar generator is able of generating the required output voltages/currents starting from a particular intensity of irradiation or insolation.

In principle the generator terminals 301, 302, 303, . . . , n may be fixedly pre-configured for particular output voltages, for instance such as to be connected directly in a voltage-compatible manner with a respective one of the electric onboard consumer systems of the aircraft, for supplying it with electricity.

Figure 7:
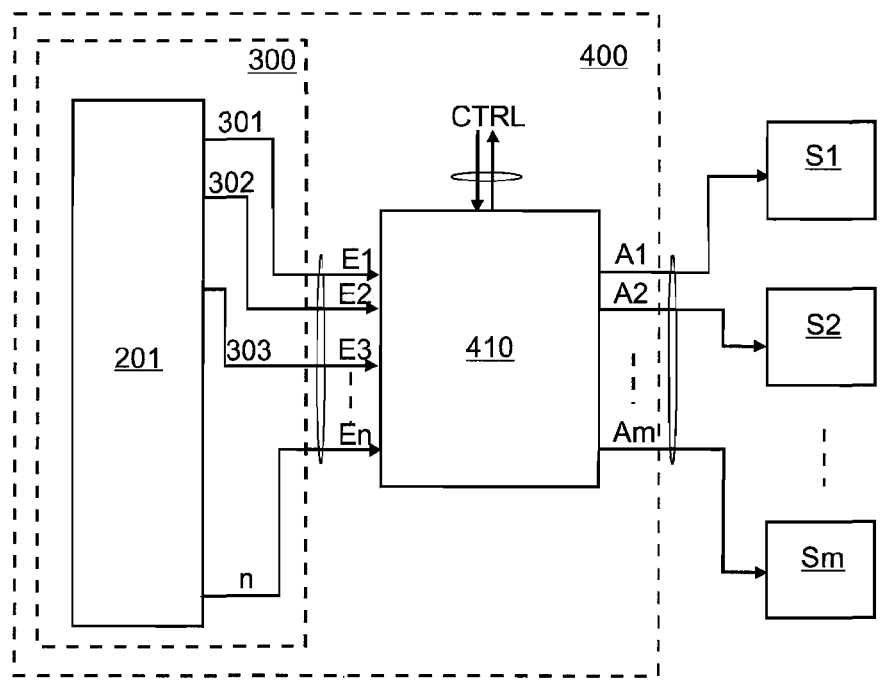
FIG. 7 is a block diagram of a supplementary power supply apparatus in accordance with an embodiment of the invention.

FIG. 7 illustrates an advantageous development of the supplementary power supply apparatus in accordance with an embodiment of the invention 400 where the generator terminals 301, 302, 303, n are connected to a control circuit 410. The control circuit 410 allows to configure and/or monitor the supplementary power supply apparatus via a corresponding control bus CTRL. Hereby a particularly high flexibility in terms of the output voltage of the supplementary power supply apparatus is achieved.

The control circuit 410 has a plurality of inputs E1, E2, E3, . . . , En interconnected with the generator terminals 301, 302, 303, . . . , n, control inputs connected to the control bus CTRL, and at least one or also several output terminals A1, A2, . . . , Am that may in particular be interconnected—permanently or for particular periods of time or in accordance with particular orders of priority—with electric onboard consumer systems S1, S2, . . . , Sm present on board the aircraft. I.e., depending on need or priority the solar generator 300 as a supplementary power supply apparatus may supply electric power to one or several or all of the consumer systems S1, S2, . . . , Sm.

Consumer systems to be considered in the case of an aircraft are, for example: the fuel management system, electrically operated devices of the onboard lavatories and/or onboard kitchens, electrically operated devices of the cabin air conditioning system, but also an energy storage device for the intermediate storage of electric power that may in a given case be coupled with suitable converter devices for the emergency supply of onboard consumers.

Customary nominal voltages of the mentioned systems are 28 V, 115 V, 230 V; it should be noted, however, that other voltage values are possible, and that the exact voltage values may be changed in accordance with the needs of various embodiments. Various embodiments of the invention provide a manner in which the voltages required in accordance with embodiments of the invention may be tapped from one and the same solar generator without requiring converter circuits etc.

The presently proposed supplementary power supply apparatus is particularly well suited for assisting the energy budget owed to mobility in the case of vehicles. The supplementary power supply apparatus may be employed particularly well with a flying machine like the aircraft discussed in the practical example, in particular through arrangement on the fuselage outer skin or integration therein in the form of a functional layer, wherein an improved efficiency may be expected particularly during cruising on account of the low external temperatures.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A supplementary power supply apparatus for electric onboard consumer of a vehicle, in particular flying machines, the apparatus comprising:
   openly disposed visible solar surfaces of several solar cells that are arranged in areas on the surface of an outer skin of the vehicle or integrated in the latter in the manner of a layer, wherein each of the solar cells comprises at least two electric terminals by which the solar cells may be interconnected to form a solar generator, and the electric terminals are executed as generator terminals of the solar generator for one or several predetermined voltages between two respective ones of the generator terminals;
   wherein the solar cells are combined into solar panels and the solar panels are mechanically connected to each other by complementarily formed marginal portions overlapping in a form-fit engagement and fastened in the marginal portions on the outer surface of the vehicle by a fastener; and
   wherein at least a part of the fastener comprises combined fastening and contacting bolts, the combined fastening and contacting bolts being connected with at least one terminal pole of the respective connected solar panels to form one of the at least two electric terminals that are connected to the generator terminals of the solar generator.

2. The supplementary power supply apparatus according to claim 1, wherein in the marginal portions of each solar panel at least one of at least two terminal poles of a solar panel is integrated for serial or parallel electrical interconnection of the solar panels.

3. The supplementary power supply apparatus according to claim 1, wherein the outer skin of the vehicle is at least partly formed by composite shell components which consist of a composite material, the visible solar surfaces being arranged at least in a partial area on the surface of the composite shell components or integrated as a functional layer in the composite shell components, so as to terminate with the outer surface.

4. The supplementary power supply apparatus according to claim 1, further comprising a control circuit which is connected by at least one input terminal to the generator terminals of the solar generator and comprises at least one output terminal, wherein the control circuit is executed to interconnect the at least one output terminal with at least two of the generator terminals such that a predetermined output voltage is present at the at least one output terminal.

5. The supplementary power supply apparatus according to claim 4, wherein the control circuit further comprises at least one control input, in particular a bidirectional control bus, through which the predetermined output voltage at the at least one output terminal may be controlled.

6. A flying machine comprising a supplementary power supply apparatus according to claim 1.

7. The flying machine, according to claim 6, comprising a fuselage having at least one fuselage portion and a fuselage outer skin, wherein at least one solar generator is arranged at least in areas, in particular within a predetermined sector angle, of the fuselage outer skin or integrated in the fuselage outer skin.

8. The flying machine according to claim 6 or 7, wherein the solar cells are connected, in at least one fuselage portion, to form at least one solar module.

9. The flying machine according to claim 6, wherein the one or several predetermined voltages correspond to voltages required by particular onboard consumer systems of the flying machine, the onboard consumer systems comprising a fuel management system and/or electrically operated devices of an onboard toilet and/or electrically operated devices of an onboard kitchen and/or an energy storage device.

* * * * *